United States Patent [19]

Brocker, Jr.

[11] 3,728,561

[45] Apr. 17, 1973

[54] HIGH SPEED MASTER-SLAVE FLIP-FLOP FREQUENCY DIVIDER

[75] Inventor: Bernard D. Brocker, Jr., Tempe, Ariz.

[73] Assignee: Motorola, Inc., Franklin Park, Ill.

[22] Filed: Jan. 12, 1972

[21] Appl. No.: 217,396

Related U.S. Application Data

[63] Continuation of Ser. No. 111,869, Feb. 2, 1971, abandoned.

[52] U.S. Cl. ....................307/291, 307/247, 307/225

[51] Int. Cl. ..............................................H03k 3/286

[58] Field of Search......................307/291, 292, 225, 307/247

[56] References Cited

UNITED STATES PATENTS

| | | | |
|---|---|---|---|
| 3,440,449 | 4/1969 | Priel et al. | 307/291 |
| 3,553,497 | 1/1971 | Smith | 307/292 X |
| 3,617,776 | 11/1971 | Priel | 307/291 |
| 3,651,336 | 3/1972 | Uchitama | 307/291 X |

*Primary Examiner*—John S. Heyman
*Attorney*—Mueller & Aichele

[57] ABSTRACT

A frequency divider capable of operating at frequencies in the order of 1 gigaHertz has a master flip-flop and a slave flip-flop. Both the master and the slave flip-flops are provided with a transistor gate circuit, the master flip-flop being directly connected to the gate circuit associated with the slave flip-flop, and the slave flip-flop being directly connected to the gate circuit associated with the master flip-flop. A switching circuit, responsive to an input electronic waveform, permits the transfer of the contents of the master flip-flop to the slave flip-flop when the input waveform is of one polarity. When the input waveform is of the other polarity, the switching circuit permits a transfer of the inverse of the slave flip-flop contents.

9 Claims, 1 Drawing Figure

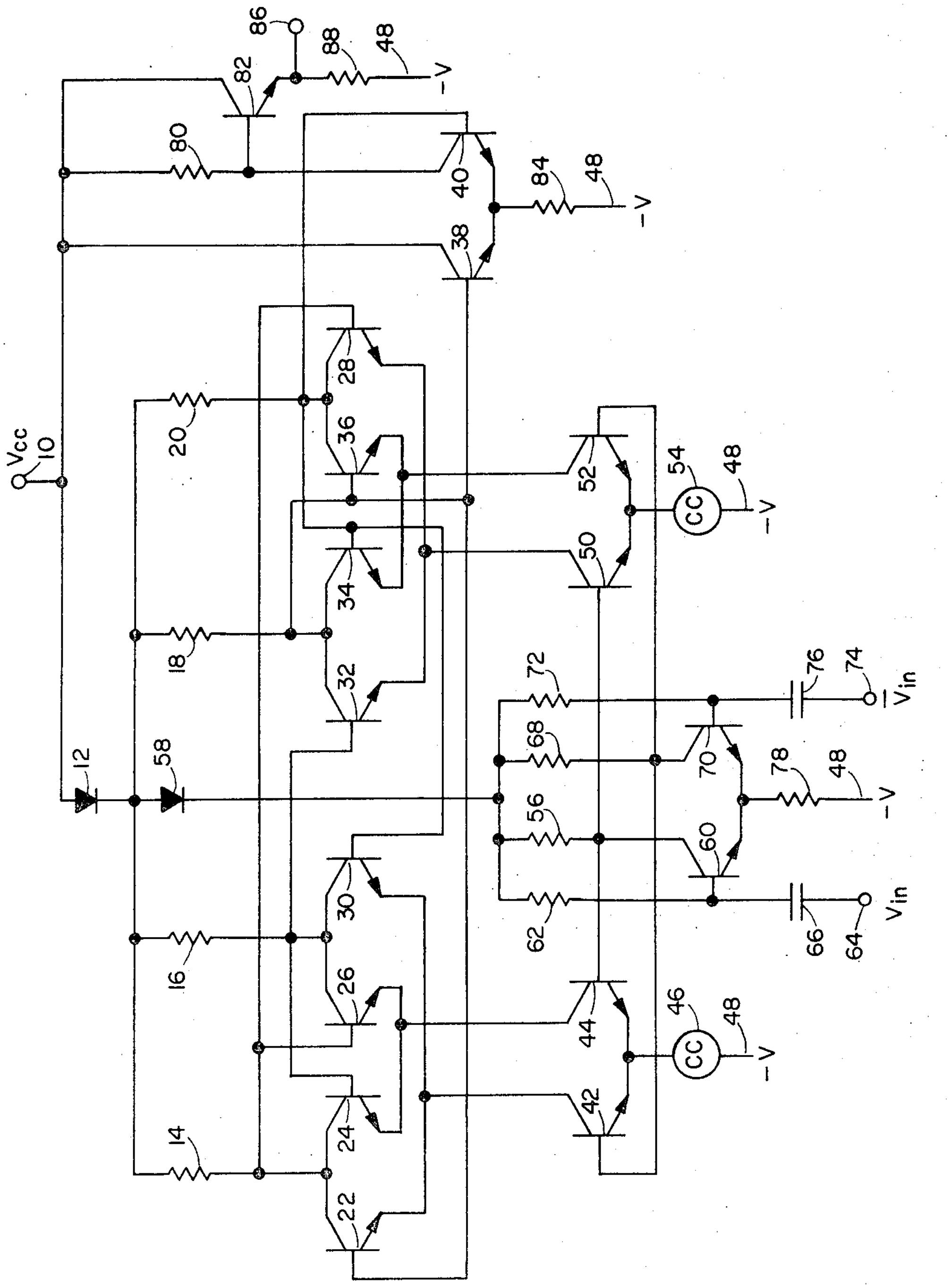
INVENTOR.
Bernard D. Broeker Jr.
BY
ATTY'S.

HIGH SPEED MASTER-SLAVE FLIP-FLOP FREQUENCY DIVIDER

This application is a continuation of Ser. No. 111,869, Feb. 2, 1971, now abandoned.

BACKGROUND

As the art progresses, higher and higher frequencies are used in digital circuits, the highest frequencies being used in the binary frequency divider or toggling flip-flop circuits. When the speed of the digital system approaches a gigaHertz, a frequency divider which will accurately divide the frequency is required so that known logic circuits can handle the divided frequency that is applied thereto. For example, 400 megaHertz can be routinely handled by known monolithic emitter coupled logic circuits. If the input wave is in the gigaHertz range, one or more frequency dividers that will operate in this range may be necessary for proper operation of the emitter coupled logic.

It is an object of this invention to provide an improved frequency divider which operates in the high frequency range.

It is a further object of this invention to provide a frequency divider that will divide a wave applied thereto which is in the gigaHertz range.

It is still a further object of this invention to provide a high speed divider capable of operating from a very low frequency to a very high frequency with no change of circuitry.

It is another object of this invention to provide a high speed divider using only active devices and resistors which can be integrated, or if desired, can be made of discrete elements.

It is still another object of this invention to provide a high speed divider which can be triggered by either a sine wave, a square wave or a pulse signal.

SUMMARY

In accordance with this invention, a divider is disclosed having two current mode flip-flop circuits cross coupled in a master-slave configuration, a pair of gates being provided for each flip-flop, a gate of each pair being coupled to each of the transistors comprising the flip-flop. When the input wave to be divided goes in one direction, positive, for example, the logic state of the master flip-flop is shifted to the slave flip-flop and when the input wave goes in the opposite polarity direction, the state of the slave flip-flop is inverted and transferred back to the master. This results in a divide by two effect. Of course, if it is desired to divide by four or by an even multiple of two, a plurality of divide by two stages may be added. Since the divider or dividers should interface directly with known emitter coupled logic circuits which require a greater voltage swing and at a different voltage level than that produced by the divider, an output stage may be provided.

DESCRIPTION

The invention will be better understood upon reading the following description in connection with the accompanying drawing in which the sole FIGURE illustrates a divide by two divider in accordance wit this invention and which includes an output stage.

The positive terminal of the constant current supply source (not shown) is connected to the terminal 10.

The terminal 10 is connected by way of the anode to cathode path of a diode 12 to a terminal of each of four resistors 14, 16, 18 and 20. The other terminal of the resistor 14 is connected to the collectors of two NPN transistors 22 and 24 and to the bases of two NPN transistors 26 and 28. Since all the transistors to be mentioned are of the NPN type, no further mention of the type thereof is necessary. The other terminal of the resistor 16 is connected to the collector of the transistor 26 and to the collector of a transistor 30 and to the base of the transistor 24 and to the base of a transistor 32. The other terminal of the resistor 18 is connected to the collector of the transistor 32 and to the collector of a transistor 34 and to the base of a transistor 36 and to the base of the transistor 22 and to the base of a transistor 38. The other terminal of the resistor 20 is connected to the collectors of the transistors 28 and 36, to the bases of the transistors 34 and 30 and to the base of a transistor 40. The emitters of the transistors 22 and 30 are connected to the collector of a transistor 42. The emitters of the transistors 24 and 26 are connected to the collector of a transistor 44. The emitters of the transistors 42 and 44 are connected together and through a constant current source 46 to the negative terminal of a supply source 48. The emitters of the transistors 28 and 32 are connected together and to the collector of a transistor 50. The emitters of the transistors 34 and 36 are connected together and to the collector of a transistor 52. The emitters of the transistors 50 and 52 are connected together and by way of a constant current source 54 to the negative supply terminal 48. The constant current sources 46 and 54 may take the form of a resistor which is high with respect to the resistors 14, 16, 18 and 20. The bases of the transistors 44 and 50 are connected directly together and through a resistor 56 and the cathode to anode path of a diode 58 to the cathode of the diode 12. The bases of the transistors 44 and 50 are also directly connected to the collector of a transistor 60 whose base is connected to the cathode to the diode 58 by way of resistor 62 and to an input terminal 64 by way of a capacitor 66. The bases of the transistors 42 and 52 are connected together and to the cathode of the diode 58 by way of a resistor 68 and to the collector of a transistor 70. The base of the transistor 70 is connected to the cathode of the diode 58 by way of a resistor 72 and to an input terminal 74 by way of a capacitor 76. The capacitors 66 and 76 may be omitted if the input applied to the terminals 64 and 74 is pulsating direct current within a predetermined voltage range. The emitters of the transistors 60 and 70 are connected together and through a relatively high resistor 78 that acts as a constant current source to the negative supply terminal 48. The collector of the transistor 38 is connected directly to the positive terminal 10. The collector of the transistor 40 is connected to the positive supply terminal 10 by way of a resistor 80 and to the base of a transistor 82 whose collector is connected directly to the terminal 10. The emitters of the transistors 38 and 40 are connected together and through a high resistor 84 to the negative terminal 48. The emitter of the transistor 82 is connected to the system output terminal 86 and through a high resistance 88 to the negative terminal 48. As will be explained, the wave to be divided by two is applied between the terminals 64 and 74 and the wave which has been divided by two and which has a high enough voltage swing and is in the proper range to operate a desired logic circuit is provided at the terminal 86.

The elements 56, 60, 62, 66, 68, 70, 72, 76 and 78 act to couple the input waves applied at the terminals 64 and 74 to the bases of the transistors 42 and 52 or to the bases of the transistors 44 and 50, and the elements 38, 40, 80, 82, 84 and 88 act to amplify the output of the divider and to shift its range, the divider output appearing at the collectors of the transistors 28 and 36 with respect to the collectors of the transistors 32 and 34. The voltage appearing at the output terminal 86 is in the proper voltage range and has a swing such as is necessary to be applied to a desired logic circuit.

It will be noted that the transistors 24 and 26 are connected as flip-flops, and that the transistors 34 and 36 are also connected as flip-flops, in that in each pair of transistors, each collector is connected to a base of the other transistor of the pair. The transistors 24 and 26 are the master flip-flop and transistors 34 and 36 are the slave flip-flop. It is also noted that the transistors 22, 30, 32 and 28 are gating transistors and that the master flip-flop comprising the transistors 26 and 24 are coupled by way of the gate 32 and the gate 28 to the respective transistors 34 and 36 of the slave flip-flop. However, the pulse produced by the several flip-flops does not get to the other flip-flop unless the gate is open. It is also noted that the gates 22 and 30 are closed when the flip flop 24 and 26 is open and that the gates 28 and 32 are closed when the flip-flop 34 and 36 is open. Being flip-flops, only one of the transistors 24 and 26 or 34 and 36 can be on, except for the short time of flipping conductivity between the two transistors of a pair thereof.

Let it be assumed that a positive wave is applied to the terminal 64 and simultaneously therewith a negative of this wave is applied to the terminal 74. Then the transistor 70 is nonconductive and the transistor 60 is conductive and current flows through the resistor 56. The bases of the transistors 44 and 50 become less positive and the transistors 44 and 50 become nonconductive. No current flows through the resistor 68 whereby the bases of the transistors 42 and 52 are positive and these transistors 42 and 52 conduct. Since the switching transistor 42 is conductive, a current path exists for the gating transistors 22 and 30. Since the switching transistor 44 is nonconductive, no current path exists for the transistors 24 and 26 and these two transistors, for the moment, do nothing. Since the switching transistor 52 is conductive, there is a current path for the transistors 34 and 36. However, as noted above, due to their cross coupling, both of the transistors 34 and 36 cannot be conductive simultaneously. Let it be assumed that the transistor 36 is conductive whereby the transistor 34 is not. Since the switching transistor 50 is nonconductive, the gating transistors 28 and 32 are nonconductive. Due to the coupling of the collector of the transistor 36 to the base of the gating transistor 30, the base of the transistor 30 is low and the transistor 30 is nonconducting. Due to the coupling of the collector of the transistor 34 to the base of the gating transistor 22, the base of the transistor 22 is high and the gating transistor 22 is conductive. The transistor 38 is also conductive and the transistor 40 is nonconductive due to the connection of their bases respectively to the collectors of the transistors 34 and 36. The emitter of the output transistor 82 is high when the transistor 40 is nonconductive, whereby the output terminal 86 is high.

Now let it be assumed that the voltage on the terminals 64 and 74 reverses whereby the transistors 44 and 50 conduct and the transistors 42 and 52 do not conduct. Now the master flip-flop 24 and 26 has a current path since the transistor 44 is conductive and the one transistor 24 or 26 which becomes conductive depends on the condition of the gating transistors 22 and 30. Since the transistor 42 is now nonconductive, the current path for the two gating transistors 22 and 30 is gone. However, the gating transistor 22 had been conductive, whereby its current flow shifts to the transistor 24 and the transistor 24 becomes conductive and the transistor 26 becomes nonconductive. The transistor 24 being conductive applies a low to the base of the gating transistor 28, whereby it is nonconductive. The transistor 26 being nonconductive, applies a high to the base of the gating transistor 32, whereby it is conductive. There being no current path for the transistors 34 and 36, these transistors 34 and 36 act temporarily as if they are not there.

Now let us assume that the input voltage at the terminals 64 and 74 reverses again whereby the transistors 42 and 52 conduct and the transistors 44 and 50 do not conduct. The transistor 42 being conductive provides a current path for the gating transistors 22 and 30. The transistor 52 being conductive, provides a current path for the flip-flop transistors 34 and 36. The gating transistor 32 had been conductive so it makes the transistor 34 conductive and the transistor 36 nonconductive. Due to the conducting of the transistor 34, the base of the transistor 22 is low and the gating transistor 22 is off while the base of the gating transistor 30 is made high by the transistor 36 being off.

Now let it be assumed that the input reverses once more, whereby the transistors 44 and 50 are conducting and the transistors 42 and 52 are not conducting. A current path is provided for the flip-flop transistors 24 and 26. Since the gating transistor 30 was conducting, the flip-flop transistor 26 becomes conducting and the transistor 24 is nonconducting. No path exists for transistors 22, 30, 34 or 36.

Now the input reverses again and there is no path for the transistors 24, 26, 28 and 32, the transistor 36 of the slave flip-flop is on and the transistor 34 is off, whereby the gate transistor 22 is on and the gate transistor 30 is off. A study of these operations will indicate that for two cycles of the input at 64 and 74, one cycle appears at the output 86, which follows the slave flip-flop 34, 36. Also, the condition of the master flip-flop 24, 26 is transferred on the next half cycle of the input to the slave flip-flop 34, 36 without phase change while the condition of the slave flip-flop 34, 36 is transferred on the next half cycle of the input to the master flip-flop with a phase reversal.

While the above explanation considers a double ended input voltage applied to the terminals 64 and 74, it is clear that one terminal 64 or 74 can be grounded and a single ended input can be applied to the other terminal.

The described frequency divider can operate at any frequency in a very great range of frequencies applied to the terminals 64 and 74 from essentially direct current to the gigaHertz range. This is due to the fact that there is no intermediate coupling circuit within each flip-flop, that is, the collectors are directly connected to the bases in each flip-flop, and the coupling of the flip-flops to the gates and of the gates to the flip-flops are direct, whereby the slowing down due to intermediate coupling is avoided. Furthermore, all current gating or switching is differential, whereby the current flow changes little if at all, and the delay due to current buildup is avoided. Very little capacity which must be charged and discharged is present in the circuit, whereby the delay due to charging and discharging is minimized. The switching currents and resistors 14, 16, 18, 20, 56 and 68 are chosen such that the resulting voltage differentials between resistor pairs 14 and 16, 18 and 20, 56 and 68 are kept small, such voltage differentials defining the depth of saturation for all conductive transistors excepting the output devices 38, 40 and 82. These reduced voltage differentials allow the direct interconnection of flip-flop elements without the reduction in operating speed due to stored charge which would be present in transistors operating in a deep saturating condition. Finally, the only coupling circuit used is in the output of the divider. The output circuitry including the transistors 38, 40 and 82 is used to amplify this small voltage differential on the master and slave flip-flop transistors up to a level commonly used for emitter coupled logic. Since this output coupling circuit operates at one half the input frequency, the use thereof will not substantially slow the divider.

While in general, a square wave input has been suggested, the described divider will operate with any shape of input wave, including sine, or impulse shape.

I claim:

1. A frequency divider including a master flip-flop and a slave flip-flop, having input means for receiving an input electronic waveform and output means for supplying an output electronic waveform, the improvement comprising:

- a first and second slave gating transistor, each having a control electrode, operatively connected to permit the slave flip-flop to assume the bi-stable state of the master flip-flop;
- a first and second master gating transistor, each having a control electrode, operatively connected to permit the master flip-flop to assume a bi-stable state opposite that of the slave flip-flop;
- means for directly connecting the output means of the master flip-flop to the control electrodes of the first and second slave gating transistors;
- means for directly connecting the output means of the slave flip-flop to the control electrodes of the first and second master gating transistors; and
- switching means, responsive to the input electronic waveform for causing the transfer of the contents of the master flip-flop to the slave flip-flop at one polarity of the input electronic waveform, and for causing the inverse of the contents of the slave flip-flop to be transferred to the master flip-flop when the input electronic waveform is of the other polarity.

2. The invention of claim 1 wherein the circuitry of the frequency divider is of the current mode type.

3. The frequency divider of claim 2 wherein the master flip-flop is comprised of a first and second transistor, the control electrode of the first transistor being directly connected to a main electrode of the second transistor and the control electrode of the second transistor being directly connected to a main electrode of the first transistor, and wherein the slave flip-flop is comprised of a first and second transistor wherein the control electrode of the first transistor is directly connected to a main electrode of the second transistor and the control electrode of the second transistor is directly connected to a main electrode of the first transistor.

4. The frequency divider of claim 3 wherein the switching means further comprises a pair of transistors operatively connected to enable either of the first and second master gating transistors to conduct and operatively connected to enable either of the pair transistors of the slave flip-flop to conduct, and a pair of transistors operatively connected to enable either the first or second slave gating transistor to conduct and to enable either of the master flip-flop transistors to conduct.

5. A frequency divider which will divide the frequency of a wave in a range from essentially direct current to the gigaHertz range comprising:

- a master flip-flop and a slave flip-flop each including a pair of transistors, each transistor having a pair of main electrodes and a control electrode in which a main electrode of each transistor of a pair thereof is directly connected to the control electrode of the other transistor of the pair thereof, in which the other main electrode of each transistor of a flip-flop pair is connected to a supply terminal by way of a respective resistor, and in which the other main electrodes of the pair of transistors comprising each flip-flop pair are connected together and through a main electrode path of a switching transistor which is respective to each flip-flop pair and a constant current source which is respective to each flip-flop pair to a supply terminal;
- a gating transistor for each flip-flop transistor, each gating transistor having a pair of main electrodes and a control electrode, a main electrode of each gating transistor being directly connected to a main electrode of a respective flip-flop transistor;
- direct coupling from main electrodes of the slave flip-flop transistors to respective control electrodes of the gating transistors that are coupled to master flip-flop transistors; and
- direct coupling from the main electrodes of the master flip-flop transistors to respective control electrodes of the gating transistors that are coupled to slave flip-flop transistors.

6. The invention of claim 5 in which an output coupling circuit is coupled to the main electrode of said slave flip-flop said output coupling circuit comprising a first, a second and a third output transistor each having a pair of main electrodes and a control electrode, means for connecting a main electrode of said first and third output transistors to a supply terminal, means for connecting a main electrode of said second output transistor to said supply terminal by way of a resistor, means for directly connecting the control electrodes of said first and second output transistors to main electrodes of respective slave flip-flop transistors and means for connecting the junction of said resistor and the main electrode of said second output transistor to the control electrode of said third output transistor.

7. The invention of claim 5 in which the other main electrodes of said gating transistors which are coupled to the master flip-flop pair are connected together and through a main electrode path of a third switching transistor and through the constant current source for said master flip-flop.

8. The invention of claim 7 in which the other main electrodes of said gating transistors are coupled to the slave flip-flop pair are connected together and through a main electrode path of a fourth switching transistor and through the constant current source for said slave flip-flop.

9. The invention of claim 8 in which the control electrodes of said switching transistor for said master flip-flop and for the gating transistors for said slave flip-flop are connected together and in which the control electrodes of said switching transistor for said slave flip-flop and for the gating transistors for said master flip-flop are connected together.

* * * * *

UNITED STATES PATENT OFFICE
CERTIFICATE OF CORRECTION

Patent No. 3,728,561 Dated Apr. 17, 1973

Inventor(s) Bernard D. Broeker, Jr.

It is certified that error appears in the above-identified patent and that said Letters Patent are hereby corrected as shown below:

Change [75] Inventor:

From "Bernard D. Brocker, Jr." to

-- Bernard D. Broeker, Jr. --

Signed and sealed this 1st day of January 1974.

(SEAL)
Attest:

EDWARD M.FLETCHER,JR.
Attesting Officer

RENE D. TEGTMEYER
Acting Commissioner of Patents